(12) United States Patent
Kim et al.

(10) Patent No.: US 7,430,962 B2
(45) Date of Patent: Oct. 7, 2008

(54) PRINTING DEVICE AND PRINTING METHOD USING THE SAME

(75) Inventors: Chul Ho Kim, Paju-si (KR); Jung Jae Lee, Gwacheon-si (KR); Tae Young Oh, Anyang-si (KR); Geun Tae Kim, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 307 days.

(21) Appl. No.: 11/479,018

(22) Filed: Jun. 29, 2006

(65) Prior Publication Data
US 2007/0157830 A1 Jul. 12, 2007

(30) Foreign Application Priority Data
Dec. 29, 2005 (KR) .................. 10-2005-0133976

(51) Int. Cl.
*B41F 17/00* (2006.01)

(52) U.S. Cl. .................... 101/389.1; 101/163

(58) Field of Classification Search ............ 101/41, 101/44, 150, 163, 389.1, 492, 493
See application file for complete search history.

(56) References Cited

U.S. PATENT DOCUMENTS

| | | | | |
|---|---|---|---|---|
| 4,878,407 | A | * | 11/1989 | Harrison et al. ............... 83/13 |
| 6,357,350 | B1 | * | 3/2002 | Kerr .......................... 101/389.1 |
| 6,759,348 | B1 | | 7/2004 | Cho et al. |
| 6,940,578 | B2 | | 9/2005 | Baek et al. |

OTHER PUBLICATIONS

Search report dated Jun. 7, 2006 for corresponding U.K. Patent Application GB 0609292.8

* cited by examiner

*Primary Examiner*—Daniel J. Colilla
*Assistant Examiner*—David Banh
(74) *Attorney, Agent, or Firm*—Brinks Hofer Gilson & Lione

(57) ABSTRACT

A printing device and a printing method using the same is disclosed. An air pocket is formed in a cliché stage to prevent a cleaning solution from permeating into a space between the cliché stage and a cliché plate, thereby preventing a lower surface of the cliché plate from being contaminated. The printing device comprises a cliché stage for fixation of a cliché plate, a plurality of vacuum holes disposed in the cliché stage for providing a vacuum to fix of the cliché plate to the cliché stage; and an air pocket surrounding the plurality of vacuum holes for providing air to minimize permeation of a cleaning solution into a space between the cliché plate and the cliché stage.

9 Claims, 7 Drawing Sheets

PRINTING DEVICE AND PRINTING METHOD USING THE SAME

This application claims the benefit of the Korean Patent Application No. P2005-133976, filed on Dec. 29, 2005, which is hereby incorporated by reference as if fully set forth herein.

TECHNICAL FIELD

The present invention relates to a method for manufacturing a liquid crystal display (LCD) device, and more particularly, to a printing device to manufacture an LCD device, and a printing method using the same.

BACKGROUND

Among various flat panel-type display devices having display screens of a few centimeters in thickness, liquid crystal display (LCD) devices are widely used in commercial applications. For example, they are employed for notebook computers, aircraft monitors and the like since they provide advantages such as low power consumption and portability.

An LCD device includes lower and upper substrates facing each other with a predetermined distance therebetween, and a liquid crystal layer formed between the lower and upper substrates.

The lower substrate includes gate and data lines crossing each other to define a unit pixel region. In addition, the lower substrate includes a thin film transistor TFT that functions as a switch and is formed adjacent to a crossing portion of the gate and data lines. Also, a pixel electrode is formed on the lower substrate and is electrically connected with the thin film transistor TFT.

The upper substrate includes a light-shielding layer, a color filter layer, and a common electrode. The light-shielding layer shields portions of the gate line, the data line and the thin film transistors except a pixel region from the light. Also, the color filter layer is formed on the pixel region, and the common electrode is formed on the upper substrate including the color filter layer and light-shielding layer.

The above LCD device includes various elements formed by a series of steps. For example, photolithography may be used to pattern the various elements.

Photolithography may increase the cost, time, and complexity of manufacturing an LCD device, since it requires a light-emission device, a mask having a predetermined pattern, and exposure and development steps.

To overcome these disadvantages of photolithography, a new patterning method that entails printing has been developed. In the printing method, a predetermined material is coated on a printing roller, and the printing roller is rotated on a substrate, thereby forming a predetermined pattern on the substrate.

FIGS. 1A to 1C are cross sectional views illustrating a printing method using a printing roller according to the related art.

As shown in FIG. 1A, first, a pattern material 30 is provided through a printing nozzle 10 and is coated on an outer surface of a printing roller 20.

Then, as shown in FIG. 1B, the printing roller 20 coated with the pattern material 30 is rotated (rolled) on a cliché plate 40 having concave and convex portions. That is, some pattern material 30b is transferred to the convex portions of the cliché plate 40, and the remaining pattern material 30a is left on the outer surface of the printing roller 20. As a result, a predetermined pattern 30a is formed on the printing roller 20 by the remaining pattern material 30a.

As shown in FIG. 1C, as the printing roller 20 is rotated on a substrate 50, the predetermined pattern 30a of the printing roller 20 is transferred to the substrate 50.

The above method using the printing roller 20 utilizes the cliché plate 40 including the predetermined concave and convex portions. When some pattern material 30b of the printing roller 20 is transferred to the convex portions of the cliché plate 40 by rotation of the printing roller 20 on the cliché plate 40, it necessarily requires a cliché stage for fixing and supporting the cliché plate 40.

Also, as shown in FIG. 1B, after using the cliché plate 40 once, some pattern material 30b is left on the convex portions of the cliché plate 40. To reuse the cliché plate 40, a cleaning process is performed to remove the pattern material from the convex portions of the cliché plate 40.

FIGS. 2A and 2B are perspective and cross sectional views schematically showing the related art cliché stage.

In the related art cliché stage, as shown in FIG. 2A, a plurality of vacuum holes 60 for vacuum-suction and fixation of the cliché plate 40 are formed on the surface of the cliché stage 45.

Although not shown, the plurality of vacuum holes 60 are connected with a vacuum pump. Accordingly, when the cliché plate 40 is put on the cliché stage 45 having the plurality of vacuum holes 60, the cliché plate 40 is fixed on the cliché stage 45 by the vacuum force provided from the vacuum holes connected with the vacuum pump.

However, the related art cliché stage has the following disadvantages.

FIG. 3 is a cross sectional view showing a cleaning process of the cliché plate according to the related art.

As shown in FIG. 3, after the cliché plate 40 is provided on the cliché stage 45, the cliché plate 40 is fixed to the cliché stage 45 by the vacuum suction force. Then, the cliché plate 40 is cleaned.

To clean the cliché plate 40, a cleaner 70 sprays a cleaning solution 75 onto the cliché plate 40. The sprayed cleaning solution 75 may permeate into a space between the cliché plate 40 and the cliché stage 45, and thus may weaken the vacuum-suction force. Accordingly, it may be difficult to fix the cliché plate 40 in place in precise alignment with the cliché stage 45, and an imprecise pattern may be formed.

In addition, if the cleaning solution 75 permeates into the space between the cliché plate 40 and the cliché stage 45, the lower surface of the cliché plate 40 may be contaminated due to the cleaning solution 75.

SUMMARY

Accordingly, the present invention is directed to a printing device and a printing method using the same, which may substantially obviate one or more problems due to limitations and disadvantages of the related art.

The printing device comprises a cliché stage for fixation of a cliché plate, a plurality of vacuum holes disposed in the cliché stage for providing a vacuum to fix of the cliché plate to the cliché stage, and an air pocket surrounding the plurality of vacuum holes. The air pocket provides air to minimize permeation of a cleaning solution into a space between the cliché plate and the cliché stage.

In another aspect, a printing method comprises fixing a cliché plate having concave or convex portions to a stage including a plurality of vacuum holes and an air pocket surrounding the vacuum holes. A pattern material is then coated on an outer surface of a printing roller, and the roller is rotated on the cliché plate. As a result, a first portion of the pattern material is printed on the convex portions of the cliché plate, and a second portion of the pattern material remains on the outer surface of the printing roller. The printing roller is then rotated on a substrate, so that the second portion of the pattern material of the printing roller is transferred to the substrate. The cliché plate may then be cleaned to remove the first portion of the pattern material from the cliché plate by supplying air to an air pocket.

It is to be understood that both the foregoing general description and the following detailed description are exemplary and explanatory and are intended to provide further explanation of the invention as claimed.

DETAILED DESCRIPTION

Reference will now be made in detail to various embodiments, examples of which are illustrated in the accompanying drawings. Wherever possible, the same reference numbers will be used throughout the drawings to refer to the same or like parts.

Figure 4A:
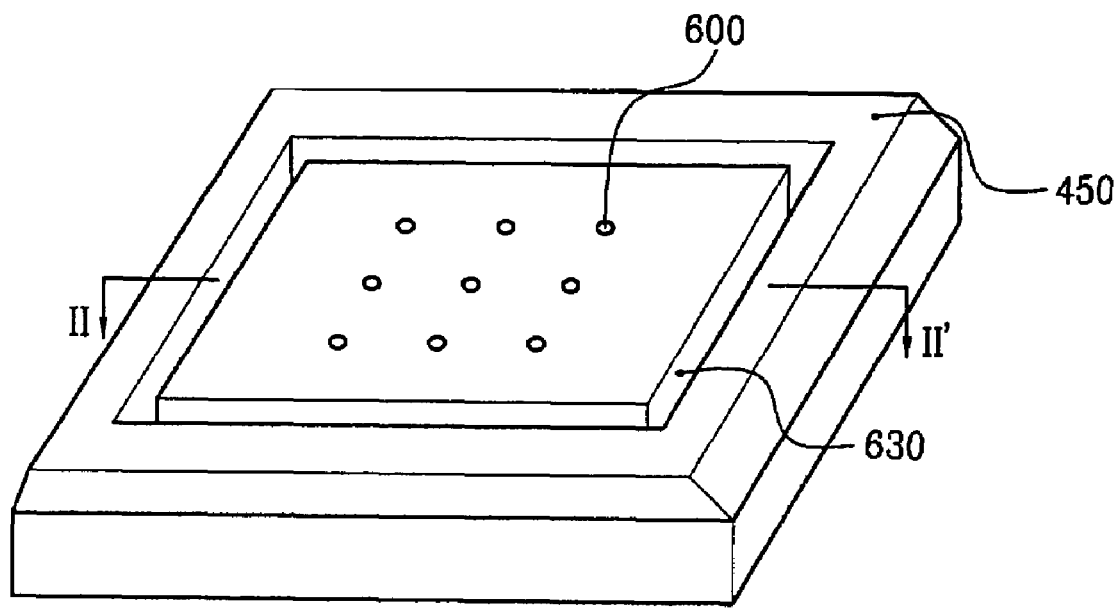
FIGS. 4A and 4B are perspective and cross sectional views of a cliché stage of a printing device according to the present invention.
Figure 4B:
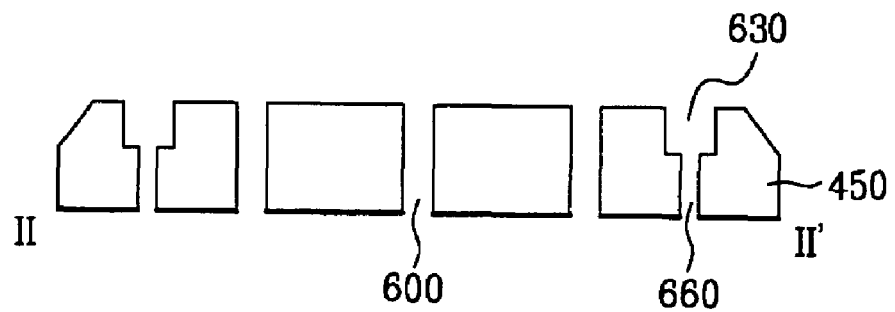

FIG. 4A is a perspective view schematically illustrating a stage of a printing device according to the present invention, and FIG. 4B is a cross sectional view along section II-II' of FIG. 4A.

As shown in FIGS. 4A and 4B, the printing device includes a cliché stage 450, a plurality of vacuum holes 600, and an air pocket 630. A cliché plate may be provided on and fixed to the cliché stage 450. Then, the plurality of vacuum holes 600 may be formed in the cliché stage 450 for vacuum suction and fixation of the cliché plate. The vacuum holes 600 may extend through the thickness of the cliché stage 450, as shown in FIG. 4B. Also, the air pocket 630 may be formed in the surface of the cliché stage 450 to prevent a cleaning solution from permeating into a space between the cliché plate and the cliché stage 450.

The cliché stage 450 may be formed in a plate shape and have an inner surface supplied with the cliché plate. That is, the cliché plate may be positioned on the inner surface of the plate-shaped cliché stage 450. The cliché stage 450 may have edges which are inclined at a predetermined angle, so that the cleaning solution may be easily discharged to the outside of the cliché stage 450 when cleaning the cliché plate.

The vacuum holes 600 in the cliché stage may fix the cliché plate by a vacuum suction force. The vacuum holes 600 may be connected to a vacuum pump to provide the vacuum suction force.

Also, the groove-shaped air pocket 630 may be formed in the upper surface of the cliché stage 450. The air pocket 630 may be positioned surrounding the vacuum holes 600. The shape of air pocket 630 may depend on the shape of cliché plate. The air pocket 630 may be formed in the shape of a rectangle as shown in FIG. 4A, for example, since the cliché plate is formed in the shape of a rectangle. Alternatively, if the cliché plate is formed in the shape of a circle, the air pocket 630 may be formed in the shape of a circle, preferably.

To prevent the cleaning solution from permeating into the lower surface of the cliché plate, the air pocket 630 may be positioned inside the edge of the cliché plate. Furthermore, an air inlet 660 may be formed inside the air pocket 630.

Figure 5:
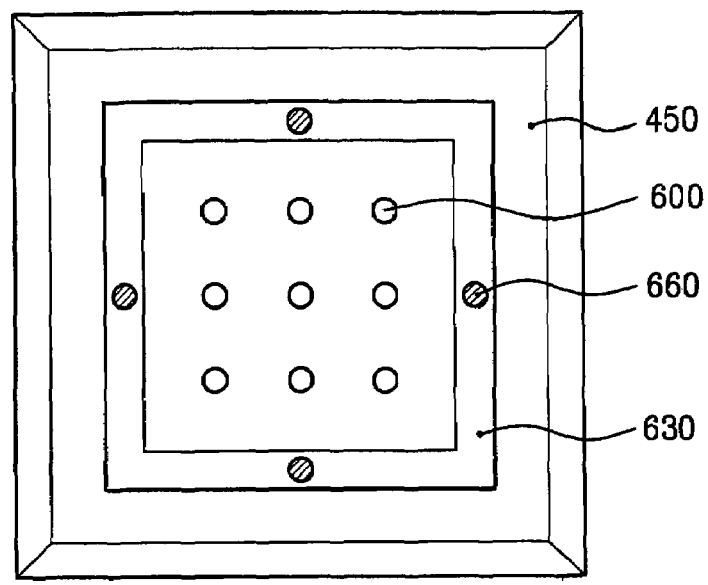
FIG. 5 is a plan view of a stage of a printing device according to a first embodiment.
Figure 6:
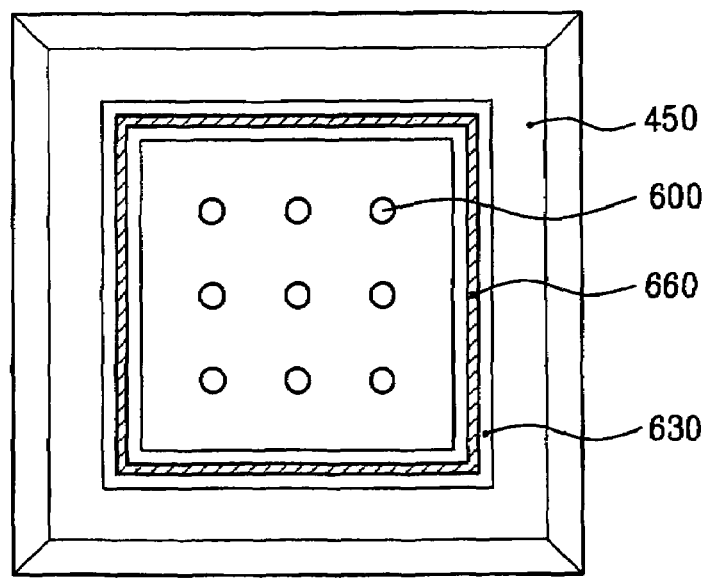
FIG. 6 is a plan view of a stage of a printing device according to a second embodiment.

FIG. 5 is a plan view of a stage according to the first embodiment, and FIG. 6 is a plan view of a stage according to the second embodiment.

As shown in FIG. 5, a plurality of hole-shaped air inlets 660 may be discontinuously formed inside an air pocket 630. At least one air inlet 660 may be formed. In FIG. 5, the four air inlets 660 are respectively formed at four sides of the air pocket 630. However, the air inlets 660 are not limited in number to the four air inlets. That is, the number of air inlets may be determined based on the size of the cliché plate and the amount of air provided from the air pocket 660.

Also, as shown in FIG. 6, a hole-shaped air inlet 660 may be continuously formed as one body inside an air pocket 630.

The principle of the stage may be explained as follows.

When cleaning the cliché plate, the space between the cliché stage and the cliché plate may be maintained under vacuum conditions by the vacuum holes 600. However, if the cleaning solution sprayed from a cleaner permeates into the space between the cliché stage and the cliché plate, it may be difficult to maintain the vacuum conditions in the space between the cliché stage and the cliché plate. The cliché plate may not remain fixed to the stage and thus may separate from the stage.

As the air is provided to the air pocket 630 through the air inlet 660 formed inside the air pocket 630 surrounding the vacuum holes 600, the air generates an air current inside the air pocket 630, so that it may be possible to prevent the cleaning solution from flowing into the vacuum holes 600. Thus, the vacuum force may be maintained in the space between the stage and the cliché plate.

Figure 7A:
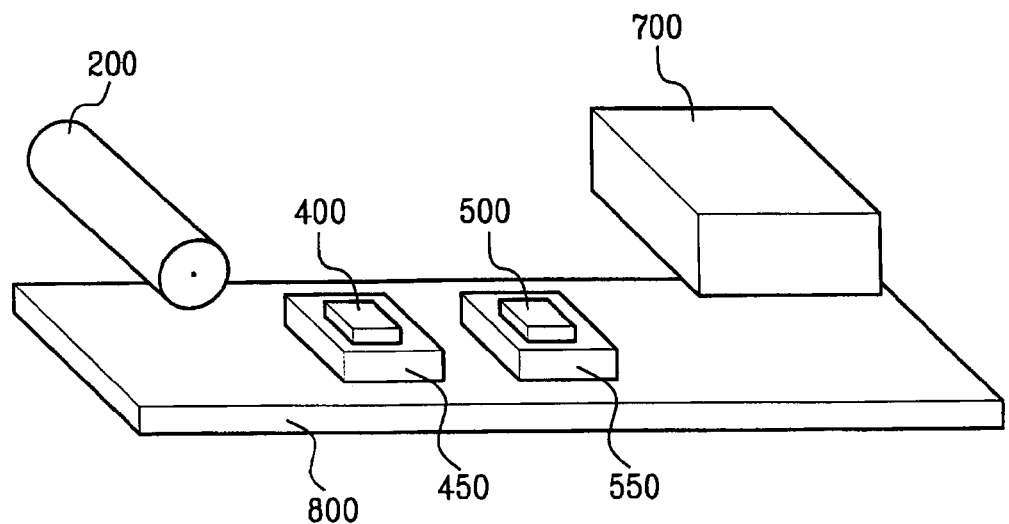
FIGS. 7A and 7B are perspective views of a printing device according to the present invention.
Figure 7B:
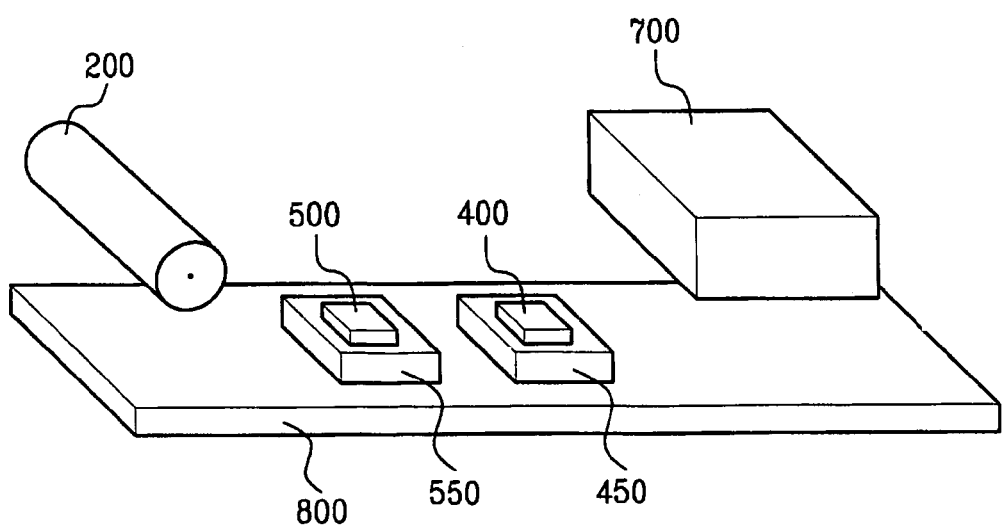

FIGS. 7A and 7B are perspective views of a printing system using a cliché stage according to the present invention.

As shown in FIGS. 7A and 7B, the printing system according to the present invention includes a printing roller 200, a cleaner 700, a rail 800, a cliché stage 450, and a substrate stage 550.

After a pattern material is coated on the printing roller 200, some pattern material may be transferred to a cliché plate 400 while the remaining pattern material forms a predetermined shape on the surface of the printing roller 200. Then, as the printing roller 200 is rotated on a substrate 500, the remaining pattern material of the printing roller 200 may be transferred to the substrate 500.

The cleaner 700 cleans the cliché plate 400. The rail 800 moves the cliché stage so that the cliché stage is positioned under the printing roller 200 or the cleaner 700. The cliché stage 450 may be provided on the rail 800, and the cliché stage 450 may fix in place the cliché plate 400. The substrate stage 550 may be provided on the rail 800 to fix in place the stage 500.

The cliché stage 450 may be identical in structure to those of FIGS. 5 and 6. Although not shown, the cleaner 700 may be comprised of a sprayer for spraying a cleaning solution, and a dryer for drying the cleaned cliché plate.

The cliché plate 400 or the substrate 600 may be moved with movement of the rail 800. However, instead of the rail 800, the printing roller 200 or the cleaner 700 may be moved. Also, the position of the cliché stage 450 and the substrate stage 550 may be variable.

A printing method using the printing system according to the present invention may be explained as follows.

Figure 1A:
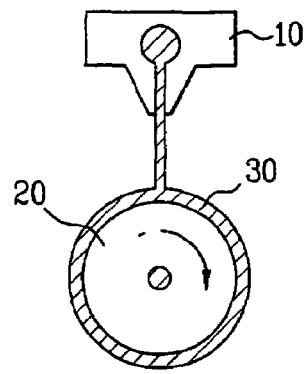
FIGS. 1A to 1C are cross sectional views of a printing method using a printing roller according to the related art.
Figure 1B:
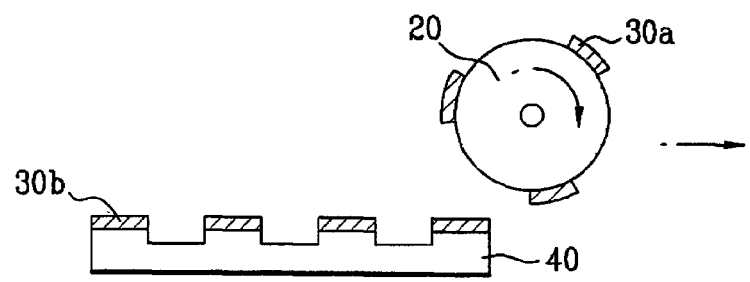
Figure 1C:
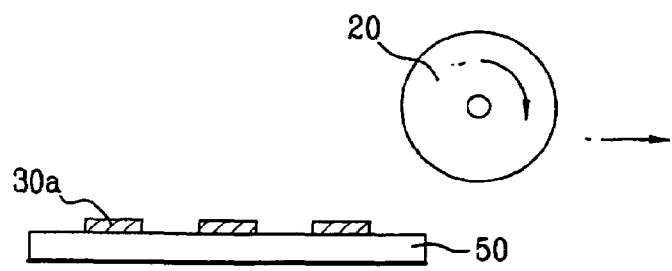
Figure 2A:
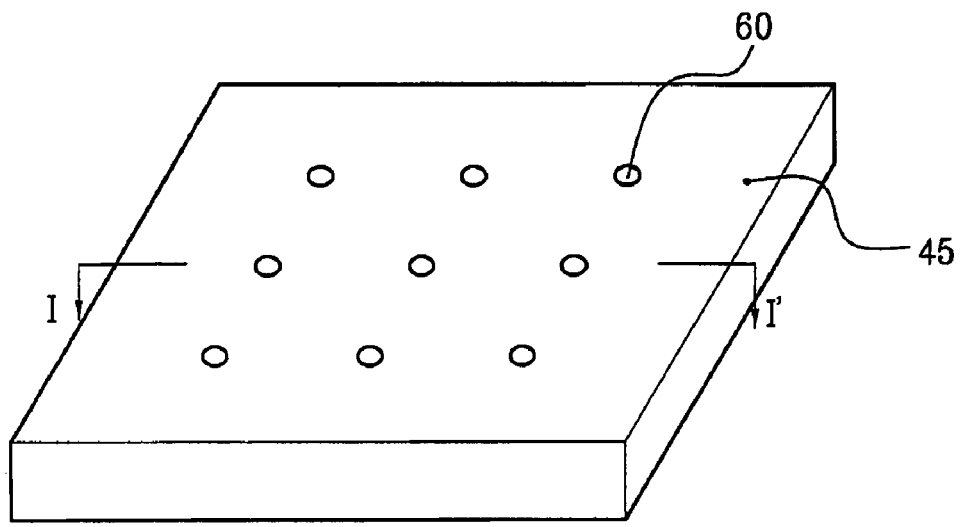
FIGS. 2A and 2B are perspective and cross sectional views of a cliché stage according to the related art.
Figure 2B:
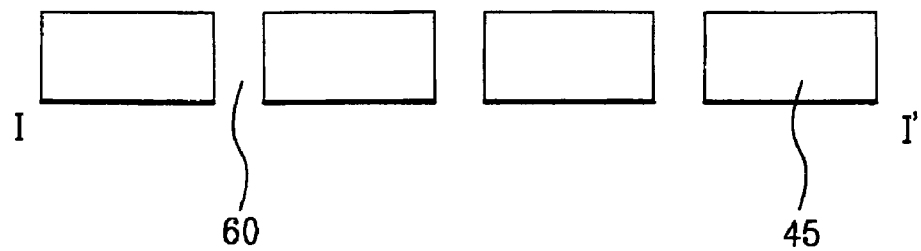

First, as shown in FIGS. 1A and 1B, the pattern material (not shown in FIGS. 7A and 7B, '30' of FIG. 1A) may be provided through a printing nozzle and coated on the outer surface of the printing roller 200.

Then, the printing roller 200 coated with the pattern material 30 may be rotated on the cliché plate 400 having convex and concave portions based on a desired pattern. Thus, some pattern material may be printed on the convex portions of the cliché plate 400, and the remaining pattern material may be left on the surface of the printing roller 200. Thereafter, as the printing roller 200 is rotated on the substrate 500, the remaining pattern material of the printing roller 200 may be transferred to the substrate 500.

To reuse the cliché plate 400 after transferring the pattern material of the printing roller to the substrate 500, a cleaning process for removing the pattern material from the convex portions of the cliché plate 400 may be required.

Figure 3:
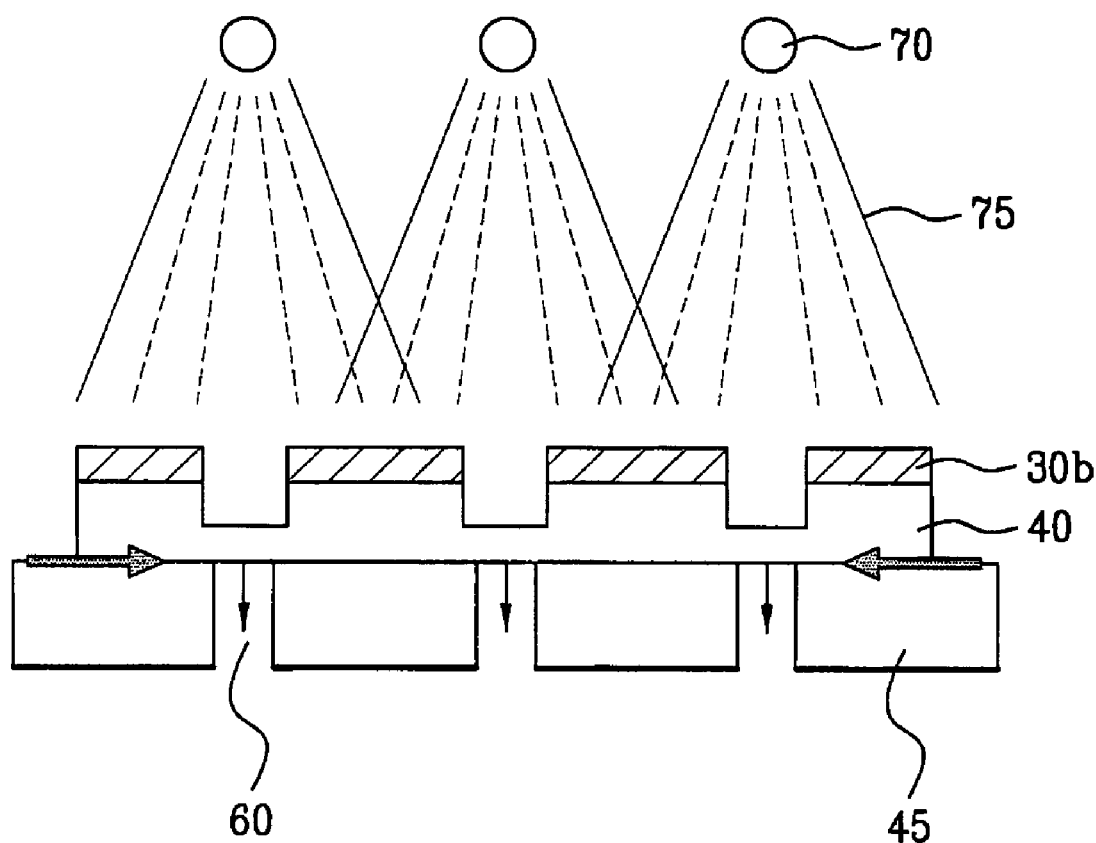
FIG. 3 is a cross sectional view showing a cliché stage during cleaning of a cliché plate according to the related art.

In the cleaning process, the cliché plate 400 may be positioned under the cleaner 700, as shown in FIG. 3, and the cleaning solution may be sprayed onto the cliché plate 400. The pattern material may thus be removed from the cliché plate 400.

The above-explained process may be repeated so that the pattern material is formed on the substrate 500.

FIGS. 8A to 8D are cross sectional views of a method for manufacturing an LCD device according to the present invention.

Figure 8A:
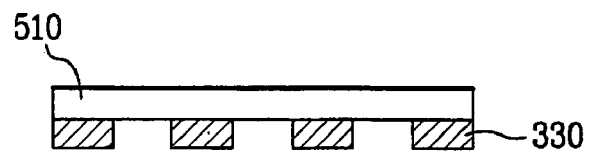
FIGS. 8A to 8D are cross sectional views of a method for manufacturing an LCD device according to the present invention.

As shown in FIG. 8A, a black matrix layer 330 may be formed on a first substrate 510. As explained above, the black matrix layer 330 may be formed using the printing roller 200 and the cliché plate.

To form the black matrix layer 330, a black matrix material (resin-based material) may be coated on the outer surface of the printing roller, and the printing roller may then be rolled on the cliché plate having concave and convex portions for the patterning of the black matrix layer. That is, some black matrix material may be printed on the convex portions of the cliché plate, and the remaining black matrix material may be left on the surface of the printing roller. Then, as the printing roller is rolled on the first substrate 510, the remaining black matrix material of the printing roller may be transferred to the first substrate 510.

Figure 8B:
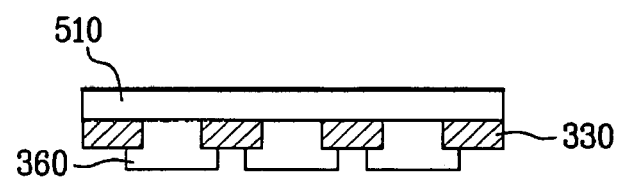
Figure 8C:

As shown in FIG. 8B, a color filter layer 360 may be formed on the first substrate 510 including the black matrix layer 330. The color filter layer 360 may be formed using the printing roller and the cliché plate for the patterning of the color filter layer.

A thin film transistor array including a gate line, a data line, a thin film transistor and a pixel electrode may be formed on a second substrate 520. Although not shown in FIG. 8C, the gate line, the data line, the thin film transistor and the pixel electrode may be formed by the above-mentioned printing system. For example, a low-resistance metal layer may be formed on an entire surface of the second substrate, and a photoresist pattern may be formed on the low-resistance metal layer, thus forming the gate line.

When forming the photoresist pattern, the above printing system may be used. That is, a photoresist material may be coated on the outer surface of the printing roller, and then the printing roller coated with the photoresist material may be rolled on the cliché plate having convex and concave portions. Thus, some photoresist material may be transferred to the convex portions of the cliché plate, and the remaining photoresist material may be left on the surface of the printing roller, whereby a predetermined pattern may be formed on the printing roller by the remaining photoresist material.

After that, the printing roller may be rolled on the second substrate 520 having the metal layer, so that the photoresist material of the predetermined pattern is transferred to the metal layer of the second substrate 520. By using the photoresist material as a mask, the metal layer may be etched to form the gate line. This method may be used to form the data line, the thin film transistor, and the pixel electrode.

After transferring a predetermined material, the above-explained cleaning process may be performed on the cliché plate.

Figure 8D:
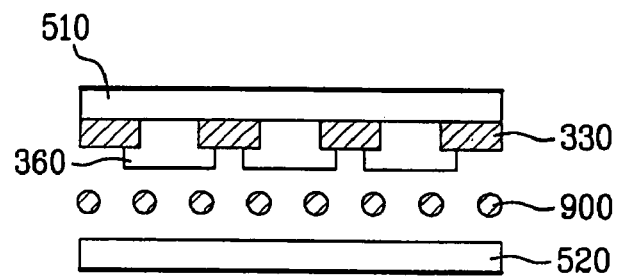

As shown in FIG. 8D, a liquid crystal layer 900 may be formed between the first substrate 510 and the second substrate 520.

The process of forming the liquid crystal layer 900 may be classified into a liquid crystal injection method and a liquid crystal dispensing method.

In the liquid crystal dispensing method, a sealant may be dispensed in a pattern having no inlet on any one of the first and second substrates 510 and 520, and a liquid crystal material may be dispensed on any one of the first and second substrates. Then, the first and second substrates may be bonded to each other.

In the liquid crystal injection method, a sealant may be dispensed in a pattern having an inlet on any one of first and second substrates, and the first and second substrates may be bonded to each other. Then, a liquid crystal material may be injected into a space between the first and second substrates through the inlet of the sealant by a capillary phenomenon and a pressure difference.

The printing device according to the present invention may have the following advantages.

In the printing device according to the present invention, an air pocket may be formed inside the cliché stage. Air may be provided to the inside of the air pocket through the air inlet and generate an air current inside the air pocket, so that it may be possible to prevent the cleaning solution from permeating into the space between the cliché plate and the cliché stage.

By preventing the permeation of the cleaning solution into the space between the cliché plate and the cliché stage, it may be possible to maintain vacuum conditions and prevent the lower surface of the cliché plate from being contaminated. Accordingly, the position of the cliché plate may not be substantially changed and a precise pattern may be formed upon printing.

It will be apparent to those skilled in the art that various modifications and variations may be made without departing from the spirit or scope of the inventions. Thus, it is intended that the present invention covers the modifications and variations of this invention provided they come within the scope of the appended claims and their equivalents.

What is claimed is:
1. A printing device comprising:
  a cliché stage for fixation of a cliché plate;
  a plurality of vacuum holes disposed in the cliché stage for providing a vacuum to fix the cliché plate to the cliché stage; and
  an air pocket surrounding the plurality of vacuum holes for providing air to minimize permeation of a cleaning solution into a space between the cliché plate and the cliché stage.

2. The printing device of claim 1, wherein the cliché stage has edges which are inclined at a predetermined angle.

3. The printing device of claim 1, wherein the air pocket is disposed about a rectangular path surrounding the plurality of vacuum holes.

4. The printing device of claim 1, wherein the air pocket comprises a groove.

5. The printing device of claim 1, wherein the air pocket has an air inlet therein.

6. The printing device of claim 5, wherein the air inlet includes at least one hole.

7. The printing device of claim 5, wherein the air inlet comprises a groove.

8. The printing device of claim 1, further comprising:
a rail disposed under the cliché stage for movement of the cliché stage;
a substrate stage provided on the rail for fixation of a substrate;
a printing roller for transferring a pattern to the substrate through the cliché plate; and
a cleaner for cleaning the cliché plate.

9. A printing method comprising:
fixing a cliché plate having concave or convex portions to a stage including a plurality of vacuum holes and an air pocket surrounding the vacuum holes;
coating a pattern material on an outer surface of a printing roller;
rotating the printing roller on the cliché plate, thereby printing a first portion of the pattern material on the convex portions of the cliché plate and retaining a second portion of the pattern material on the outer surface of the printing roller;
rotating the printing roller on a substrate, thereby transferring the second portion of the pattern material from the printing roller to the substrate; and
cleaning the cliché plate, thereby removing the first portion of the pattern material from the cliché plate, wherein the cleaning comprises supplying air to an air pocket.

* * * * *